United States Patent [19]

Isayama et al.

[11] 4,245,224
[45] Jan. 13, 1981

[54] DRIVE CIRCUIT FOR INK JET DISCHARGING HEAD

[75] Inventors: Takuro Isayama, Tokyo; Takeshi Takemoto; Tsutomu Sato, both of Yokohama; Takao Fukazawa, Tokyo, all of Japan

[73] Assignee: Ricoh Co., Ltd., Tokyo, Japan

[21] Appl. No.: 943,945

[22] Filed: Sep. 20, 1978

[30] Foreign Application Priority Data

Sep. 26, 1977 [JP] Japan .................................. 52-114722

[51] Int. Cl.³ .......................................... G01D 15/18
[52] U.S. Cl. .................................. 346/75; 346/140 R
[58] Field of Search ........................... 346/75, 140 R

[56] References Cited

U.S. PATENT DOCUMENTS

| | | | |
|---|---|---|---|
| 3,661,304 | 5/1972 | Martinez et al. | 346/75 X |
| 3,925,788 | 12/1975 | Kashio | 346/140 R X |
| 3,946,398 | 3/1976 | Kyser et al. | 346/140 R X |
| 4,034,380 | 7/1977 | Isayama | 346/140 PD |
| 4,042,937 | 8/1977 | Perry et al. | 346/140 R X |
| 4,126,867 | 11/1978 | Stevenson, Jr. | 346/140 PD |
| 4,161,670 | 7/1979 | Kern | 346/140 PD X |

Primary Examiner—George H. Miller, Jr.
Attorney, Agent, or Firm—Burgess, Ryan and Wayne

[57] ABSTRACT

A drive circuit for an ink-on-demand type ink jet discharging head used for generating characters and patterns with the jet of ink. A driving pulse delivery circuit is conneted to the ink jet discharging head for delivering it with the driving pulses for causing it to discharge the jet of ink. A control circuit for controlling the voltage of the driving pulses applied to the switching element is connected to a switching element of the driving pulse delivery circuit. The voltage of the driving pulses applied to the switching element may be maintained higher than that of the pulses applied in the normal operation for a predetermined time interval after the driving pulse delivery circuit and the control circuit are turned on so that the pulses applied to the head are stronger than those applied in the normal operation.

2 Claims, 2 Drawing Figures

4,245,224

DRIVE CIRCUIT FOR INK JET DISCHARGING HEAD

BACKGROUND OF THE INVENTION

The present invention relates to a drive circuit for an ink jet discharging head for generating characters and patterns.

Various means for preventing the clogging of the exit orifice of the ink jet discharging head have been invented and demonstrated. When the ink jet discharging head is left unused for a long time, sediments and solid matters accumulate at the exit orifice of the head so that the normal jet of ink cannot be discharged, thus resulting in many problems.

SUMMARY OF THE INVENTION:

The present invention provides a drive circuit for an ink-on-demand type ink jet discharging head for generating and recording characters and patterns. A control circuit is connected to the input terminal of a switching element of a driving pulse delivery circuit which in turn is connected to the ink jet discharging head. The control circuit controls the voltage of the driving pulses applied to the switching element in such a way that the voltage of the driving pulses may be maintained higher than that of the pulses applied in the normal operation for a predetermined time after both the deliver and control circuits are turned on, whereby the pulses applied to the ink jet discharging head when the latter is started are stronger than that of those applied in the normal operation. Therefore when the ink jet discharging head is activated, it discharges the jet of ink under relatively high pressure so that sediments and solidified matters accumulated at the exit orifice of the nozzle may be blown out and after a predetermined time the pressure of the jet of ink drops to a normal pressure optimum for recording.

Figure 1:
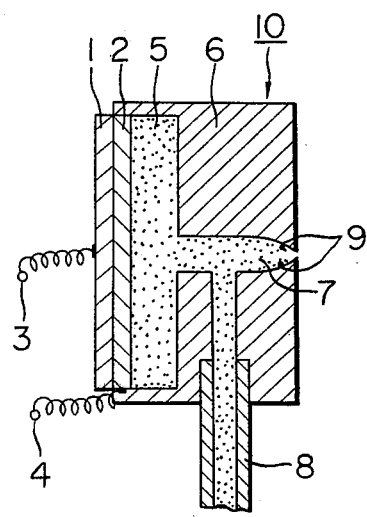
FIG. 1 is a side elevational view of an ink-on-demand type ink jet discharging head.

DESCRIPTION OF THE PREFERRED EMBODIMENT:

Referring to FIG. 1, an ink-on-demand type ink jet discharging head 10 comprises a piezoelectric crystal element 1 with terminals 3 and 4, a stainless steel diaphragm 2, an ink chamber 5, a nozzle body 6 with an exit orifice or a nozzle hole 7, an ink supply pipe 8 and sediments and solidified matters 9. When the driving pulses are applied to the terminals 3 and 4, the diaphragm 2 vibrates in unison with the piezoelectric crystal element 1 so that a jet of ink is discharged through the exit orifice 7.

When the ink head is not used for a relatively long time, sediments and coagulated matters accumulate at the exit orifice 7. When these matters are not sufficiently hardened, they may be driven away with the jet of ink by intensifying the vibration of the piezoelectric crystal element 1 so that the normal jet of ink may be formed.

Figure 2:
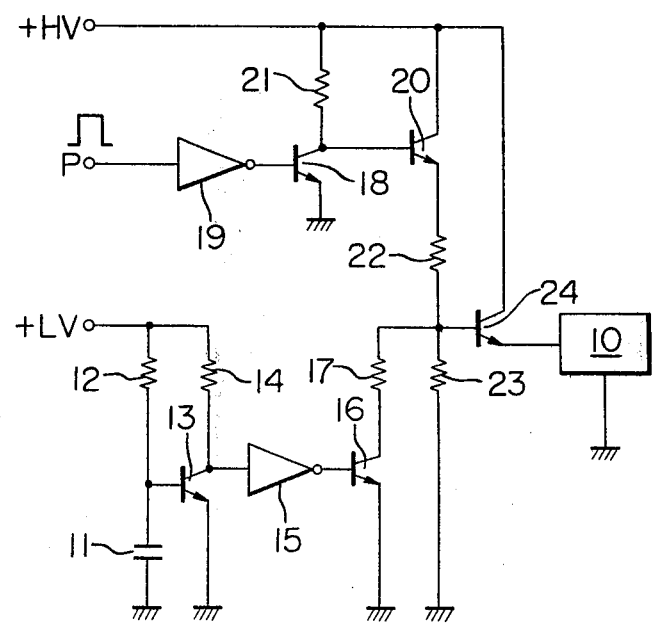
FIG. 2 is a diagram of a drive circuit for driving the ink jet discharging head.

FIG. 2 shows a diagram of a circuit for causing the intensified vibration of the piezoelectric crystal element 1 for a predetermined time when the ink head is started and thereafter returning the piezoelectric oscillator 1 to the normal vibration. When +HV and +LV are applied to the circuit from a power source (not shown), a capacitor 11 is charged through a resistor 12, resulting in a gradual increase in voltage across the capacitor 11. When the voltage across the capacitor 11 is so low that a transistor 13 remains disabled, the voltage at the junction point between the transistor 13 and a resistor 14 equals +LV and is inverted by an inverter 15 and applied to the base of a transistor 16. As a result, the transistor 16 also remains disabled and no current flows through a resistor 17. When no pulse P is applied to an inverter 19, its output is high so that a transistor 18 is enabled. Since the base voltage of a transistor 20 is low because of the voltage drop across a resistor 21, the transistor 20 remains disabled so that the base voltage of a transistor 24 is low and consequently the transistor 24 remains disabled.

When the ink injection pulse P is applied to the inverter 19, the transistor 18 is disabled so that the base voltage of the transistor 20 rises and consequently the transistor 20 is enabled. The current flows through both the resistors 22 and 23 and a voltage divided by these resistors is applied to the base of the transistor 24 so that the latter is enabled to actuate the ink jet discharging head 10. The values of the resistors 22 and 23 are so selected that the voltage of the driving pulse applied to the ink jet discharging head 10 is higher than an optimum voltage of the driving pulses which are applied to the ink head for forming the normal jet of ink.

When the voltage across the capacitor 11 rises a predetermined time after the circuit has been turned on so that the transistor 13 is enabled, the collector voltage of the transistor 13 drops and is inverted by the inverter 15. Consequently, the base voltage of the transistor 16 rises so that the latter is enabled. As a result, the current from the transistor 20 flows not only through the resistors 22 and 23 but also through the resistor 17 so that the base voltage of the transistor 24 becomes lower than when the transistor 16 remained disabled. Consequently the driving pulses applied to the ink jet discharging head 10 become smaller as compared with the ones at the instant when the circuit was turned on. The value of the resistor 17 is so selected that when the transistor 13 is enabled the ink head may form the normal jet of ink under an optimum pressure.

From the above description, it can be seen that the jet of ink issuing through the exit orifice may be automatically intensified for a predetermined time interval after the drive circuit is turned on, but it should be noted that a time for intensifying the jet of ink may be controlled manually.

What is claimed is:

1. A drive circuit for an ink-on-demand type ink jet discharging head comprising:
    a ink-on-demand type head having a piezoelectric crystal element,
    a high voltage power source,
    a first transformation circuit for transforming the high voltage from said high voltage power source to a voltage corresponding to an input signal and for applying the transformed high voltage to said piezoelectric crystal element of said ink-on-demand type head,
    a low voltage power source,
    a second transformation circuit for transforming said high voltage to a low voltage and for applying said transformed low voltage to said piezoelectric crystal element of said ink-on-demand type head, and timing control means functioning when the low voltage from said low voltage power source is applied thereto, for effectively increasing the amplitude of said transformed high voltage for a predetermined initial period.

2. A drive circuit for an ink-on-demand type ink jet discharging head having a piezoelectric crystal element, comprising:

a voltage divider comprising a first variable impedance element in series with a parallel combination of a second variable impedance element and a fixed impedance element, and an output terminal at the common junction of all of said elements;

means for coupling said output terminal to said piezoelectric crystal element;

means for applying a fixed voltage across said voltage divider;

means for varying the impedance of said first element in accordance with an ink jet print signal, and control means responsive to a start signal for maintaining the impedance of said second element at one predetermined value for a desired initial time period, and thereafter changing the impedance of said second element to a substantially different value, to cause said print signal to initially result in relatively large voltage amplitude changes at said output terminal and subsequently result in relatively small voltage amplitude changes at said terminal.

* * * * *